United States Patent [19]
Duffey

[11] Patent Number: 5,129,573
[45] Date of Patent: Jul. 14, 1992

[54] METHOD FOR ATTACHING THROUGH-HOLE DEVICES TO A CIRCUIT BOARD USING SOLDER PASTE

[75] Inventor: Gregory A. Duffey, Houston, Tex.
[73] Assignee: Compaq Computer Corporation, Houston, Tex.
[21] Appl. No.: 782,428
[22] Filed: Oct. 25, 1991
[51] Int. Cl.[5] .............................................. B23K 31/02
[52] U.S. Cl. ................... 228/180.1; 228/135; 228/187; 228/248
[58] Field of Search ............... 228/180.1, 248, 135, 228/187

[56] References Cited

U.S. PATENT DOCUMENTS

| | | | |
|---|---|---|---|
| 3,107,414 | 10/1963 | Sterling | 228/180.1 |
| 4,044,460 | 8/1977 | Schachter | 228/135 |
| 4,215,025 | 7/1980 | Packer et al. | 228/180.1 |

Primary Examiner—Kurt Rowan
Assistant Examiner—Jeffrey T. Knapp
Attorney, Agent, or Firm—Christopher D. Keirs

[57] ABSTRACT

A process is disclosed from mounting through-hole components having closely-spaced electrical leads to a printed board (PCB) using solder paste. The process comprises applying conventional solder paste to alternating through-holes in an array of through-holes, inserting the through-hole component, applying solder paste to the remaining through holes on the opposite side of the circuit board and subsequently melting the solder (typically in a reflow oven) to form both a mechanical and an electrical connection of the through-hole component to the printed wiring board. Practice of this process alleviates the problem for solder bridges forming between adjacent leads or through-holes. Moreover, this process allows a PCB to be equipped with both surface mount and through-hole components without the need for a separate wave soldering operation to secure the through-hole devices.

7 Claims, 2 Drawing Sheets

METHOD FOR ATTACHING THROUGH-HOLE DEVICES TO A CIRCUIT BOARD USING SOLDER PASTE

BACKGROUND OF THE INVENTION

1. Field of the Invention

This invention relates to printed circuit boards (PCB's). More particularly, it relates to printed circuit boards having both plated through-holes and solder pads for surface mount electronic components.

2. Description of the Problem and the Related Art

In integrated structures such as those associated with semiconductor circuits commonly used in digital computers, the first level of packaging consists of a number of switching circuits fabricated on a single part called a chip. The chip is mounted in a structure called a module, which provides environmental protection for the chip and permits electrical interconnection to be made to the next level of package. Modules are normally provided in standard configurations to allow for the design of general-purpose manufacturing equipment and higher-level packages. One particularly common package is the dual-in-line pin ("DIP" or "d-i-p") configuration in which a generally rectangular plastic block containing the semiconductor chip is equipped with two rows of equally-spaced pins which exit the encapsulating plastic block on its opposing longer sides and are provided with a right-angle bend which directs the leads in the downward direction. The Texas Instruments 7400 series of integrated circuits typically have d-i-p leads spaced 0.100 inch apart. However, later generations of d-i-p chips have smaller lead spacings, now commonly on the order of 0.050 inch.

Signal wires (traces) on printed circuit boards carry signals between modules and between modules and input/output connections to the circuit board. On computer circuit boards the terminals that carry the logic signals to the modules and to the input/output terminals are called logic service terminals (LST's), those that supply power to the various modules are called power service terminals (PST's), and connections between wiring layers in the board are called vias or via service terminals (VST's). LST's and PST's may be plated through-holes which extend the full thickness of the board and open to solder pads on both surfaces of the board. Electrical or electronic components ("modules") designed to mount to PCBs by means of plated through-holes typically have depending metal leads which are spaced apart and sized to fit into corresponding plated through-holes and extend a small distance (approximately 0.1 inch) beyond the undersurface of the PCB (often called the "solder side" of the PCB).

An alternative to through-hole techniques for mounting components on PCBs is surface mount technology (SMT) wherein the leads of electrical components are soldered to metal pads plated on the surface of a printed wiring board. In this technique, a solder paste comprising solder powder and a solder flux or vehicle system is screened onto the PCB through a stencil or screen to cover discreet solder pads. Powder size and shape affect the solder paste by determining the applications method, printability, and tendency toward solder balling. Powder in the 40 to 75 micron range is primarily used for stencil applications. Powder in the 20 to 45 micron range is primarily used for syringe, screen printing and fine pitch stencil applications. Following application of the solder paste, electrical components are precisely placed on the PCB such that their coplanar leads contact corresponding pads on the circuit board which are coated with a layer of solder paste. The solder paste typically has sufficient adhesive strength to hold the components in position until the solder is melted. However, if additional mechanical security is required (for instance if the PCB will be inverted and heated with components hanging on its underside) a separate adhesive may be employed to further secure the components to the PCB.

After application of the solder paste and placement of the electrical components, the entire PCB assembly is heated in a reflow oven to melt the solder in the solder paste thereby forming solder joints which permanently affix and electrically connect the components to the PCB. The assembly is then washed to remove the flux residue and tested.

Although use of SMT components generally offers higher circuit densities inasmuch as the spacing between leads of SMT components (the lead "pitch") can be significantly reduced from that of equivalent through-hole devices, at the present state of the art, SMT components generally have significantly less mechanical strength in terms of their physical connection to the PCB than devices mounted by means of through-holes. For most electronic components, this strength difference is inconsequential and if such a problem exists, the use of an adhesive to secure the package to the surface of the PCB will usually suffice. However, for electrical components such as cable connectors and chip sockets, mechanical strength is of great importance since the device must not only provide electrical connection, it must also withstand the mechanical loads imposed by connecting and releasing cables, plug-in components, and the like. At present, there are few if any surface mount components which can substitute for through-hole devices of this sort. Accordingly, many printed circuit boards are equipped with both solder pads for SMT components and plated through-holes for devices such as sockets and cable connectors. Conventionally, through-holes devices are connected to the PCB by machine wave soldering—i.e., the solder side of the circuit board is passed across a wave of molten solder. If two clean metal surfaces are held together and dipped into molten solder, the solder will wet the metal and climb up to fill the gaps between the adjacent surfaces. This phenomenon is the result of capillary action. If the metal surfaces are not clean, the solder cannot wet the surfaces to be soldered, and the solder will not fill the joint. Capillary action causes the molten solder to fill the annular space between the component lead and the walls of the plated through-hole. Upon cooling and solidifying, the solder forms a fillet around the lead and the ends of the plated through-hole.

As is generally known in the art, it is possible to mount through-hole components to PCBs using screened solder paste. In this technique, solder paste is screen printed onto the through-holes in the PCB which are designed to receive the electrical leads of through-hole components. The components are subsequently inserted (i.e., the leads of the components are pushed through the solder paste and into the through-holes, carrying some of the solder paste with them) and the assembly is then heated in a reflow oven to melt the solder which forms fillets around the leads of the through-hole components.

However, a problem arises when this technique attempted on components have leads spaced less than about 0.075 inch apart. Apparently, as the leads of the component are pushed into the plated through-hole covered with solder paste, some of the solder paste is displaced laterally, causing a solder bridge to occur between adjacent leads (or plated through-holes) when the PCB is heated in the reflow oven.

The present invention solves this problem.

SUMMARY OF THE INVENTION

The invention disclosed herein is a process for mounting components with a plurality of closely-spaced depending electrical leads to a printed circuit board (PCB) having through-holes for accommodating such leads using solder paste.

The process comprises applying conventional solder paste to alternating through-holes in an array of through-holes, inserting the through-hole component, applying solder paste to the remaining though holes on the opposite side of the circuit board and subsequently melting the solder (typically in a reflow oven) to form both a mechanical and an electrical connection of the component to the printed wiring board.

DETAILED DESCRIPTION

Figure 1:
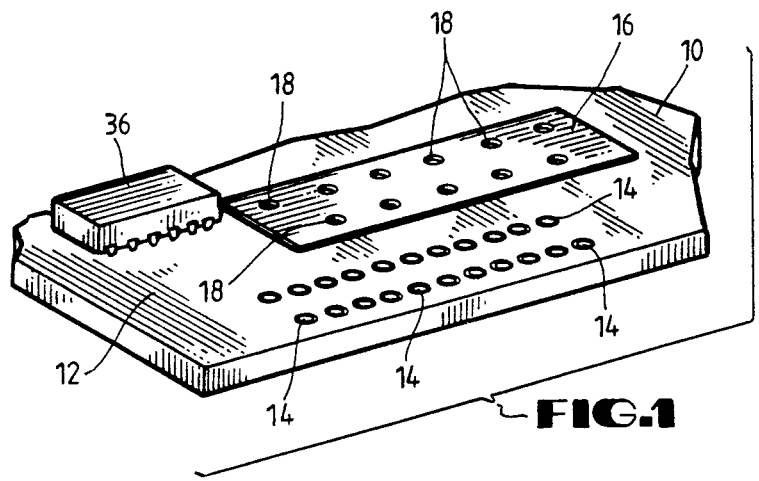
FIG. 1 is a perspective view of a typical printed circuit board having a two-row array of through-holes and a stencil for solder paste positioned above the array of through-holes.

Reference is made to the embodiment of the invention shown in the drawing figures. FIG. 1 shows printed circuit board 12 having an upper surface 10 to which is mounted electronic component 36. PCB 12 is also shown to have an array of plated through-holes 14 comprising two parallel rows of eleven plated through-holes each. In the PCB 12 illustrated in the drawing figures, this array of plated through-holes 14 is designed to receive the leads 26 of a cable connector 24 (as may be seen in FIG. 4).

Also shown in exploded fashion in FIG. 1 is stencil 16 which comprises openings or holes 18. The openings 18 in stencil 16 are positioned such that when stencil 16 is properly positioned on upper surface 10 of PCB 12, the openings 18 align with alternating plated through-holes 14 in the d-i-p array of plated through-holes. Stated another way, the openings in stencil 16 are staggered such that for any two adjacent plated through-holes 14 (either left-to-right on the same row or front-to-back on opposite rows) one hole 14 will be aligned with an opening 18 in stencil 16 and the other hole 14 will be covered by a solid portion of stencil 16.

Figure 2:
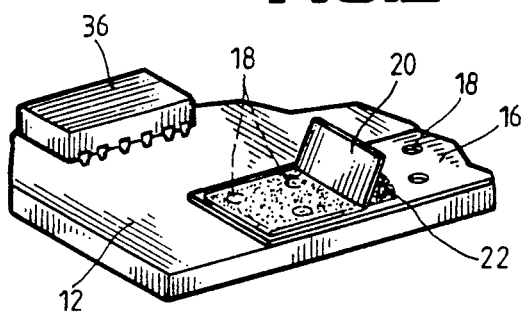
FIG. 2 shows solder paste being applied to the circuit board through the stencil.

Following placement of stencil 16 on upper surface 10, a suitable quantity of solder paste 22 is applied to the top surface of the stencil. As illustrated in FIG. 2, a squeegee or doctor blade 20 is then used to wipe solder paste 22 across the top of stencil 16 thereby forcing the solder paste 22 into openings 18 and extending into plated through-holes 14 approximately 2 mils from PCB upper surface 10. Although it is possible to accomplish this application of solder paste in selected areas of PCB 12 as shown in the drawing figures, those skilled in the art will appreciate that it will often be more convenient to apply the solder paste with the same stencil or screen and at the same time that application of solder paste is made to other areas of the PCB such as for the attachment of SMT components. Thus, it should be appreciated that component 36 shown mounted on upper surface 10 of PCB 12 is included for the purpose of illustration only and more typically, at least one side (i.e., surface) of PCB 12 will not be populated with components at the time of solder paste application. Most commonly, stencil 16 will cover all or almost all of upper surface 10 and squeegee or doctor blade 20 will extend approximately the entire width of PCB 12.

Figure 3:
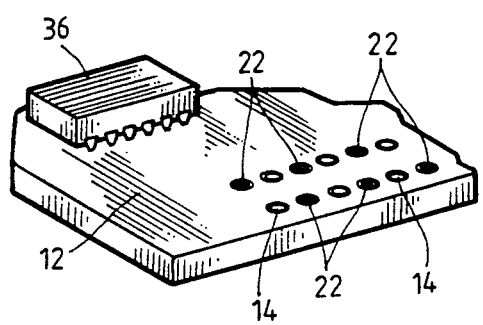
FIG. 3 shows the circuit board following the first application of solder paste.

FIG. 3 shows upper surface 10 of PCB 12 following application of the solder paste and removal of stencil 16. As may be seen in this drawing, solder paste 22 now covers alternating plated through-holes 14 in the d-i-p array of through-holes.

Figure 4:
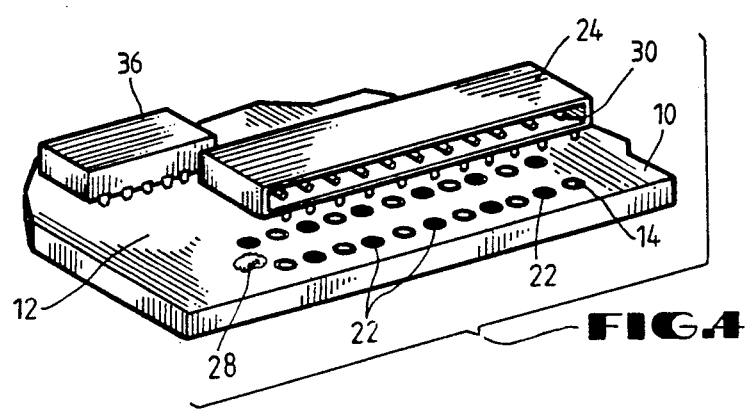
FIG. 4 shows a through-hole connector positioned for insertion above the array of through-holes.

FIG. 4 is a partially exploded view of connector 24 being inserted. Connector 24 is a cable connector in the illustrated embodiment. It comprises connector pins 30 for mating with a corresponding female connector and depending leads 26 which are sized and spaced to fit into plated through-holes 14. However, unlike most through-hole devices, leads 26 are preferably sized in length such that they do not project from the undersurface of PCB 12 when connector 24 is fully seated on upper surface 10 of PCB 12. As further illustrated in FIG. 4, one or more dabs or spots of adhesive 28 may optionally be applied to either the PCB or the component being mounted to further mechanically secure the component to the PCB. A suitable adhesive for this purpose has been found to be Loctite Chipbonder 348 (Loctite Corporation, Hartford, Conn. 06105-2040).

Figure 5:
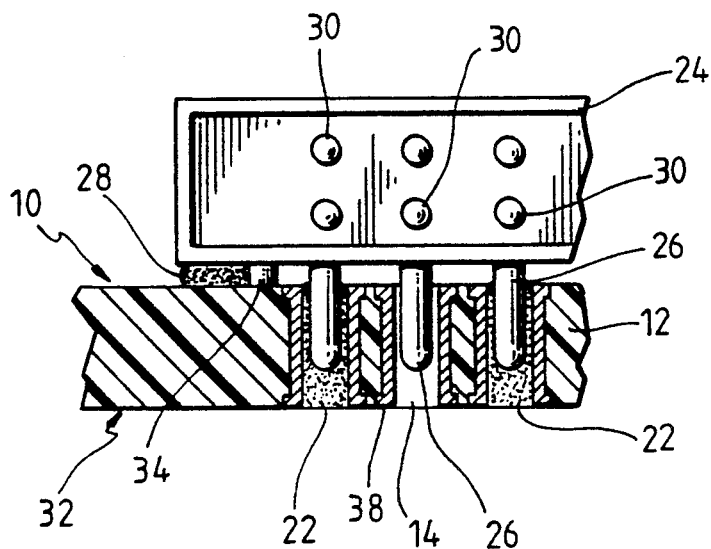
FIG. 5 is a cross sectional view of the circuit board showing the leads of the connector in the through-holes of the PCB.

FIG. 5 is a cross sectional view of PCB 12 taken along a plane which intersects one row of plated through-holes 14. As seen in this figure, connector 24 may be equipped with standoff 34 which prevents the body of connector 24 from contacting upper surface 10 of PCB 12. This feature helps to avoid unwanted laterally displacement of solder paste 22 which could obtain if the body of connector 24 were pressed against the surface of the circuit board having solder paste applied thereon. Also to be seen in FIG. 5 is the fact that plated through-holes 14 comprise metallic barrel 38 which lines the wall of the cavity and extends to lands on the upper surface 12 and undersurface 32 of PCB 12.

FIG. 5 also illustrates the effect of lead insertion on solder paste 22. It is contemplated that as leads 26 are inserted in plated through-holes 14, the solder paste 22 covering every other hole 14 is pushed into the cylindrical cavity of the plated through-hole with the leads 26 acting as a piston within the cylinder defined by the barrel 38 of plated through-hole 14. This action pushes solder paste 22 further into selected holes 14 and into the annular space between the lead 26 and barrel 38. At this stage of the process, only every other plated through-hole 14 has had solder paste 22 applied and thus it will be noted that the middle lead 26 of the three leads of component 24 shown in FIG. 5 has no solder paste 22 surrounding it.

Figure 6:
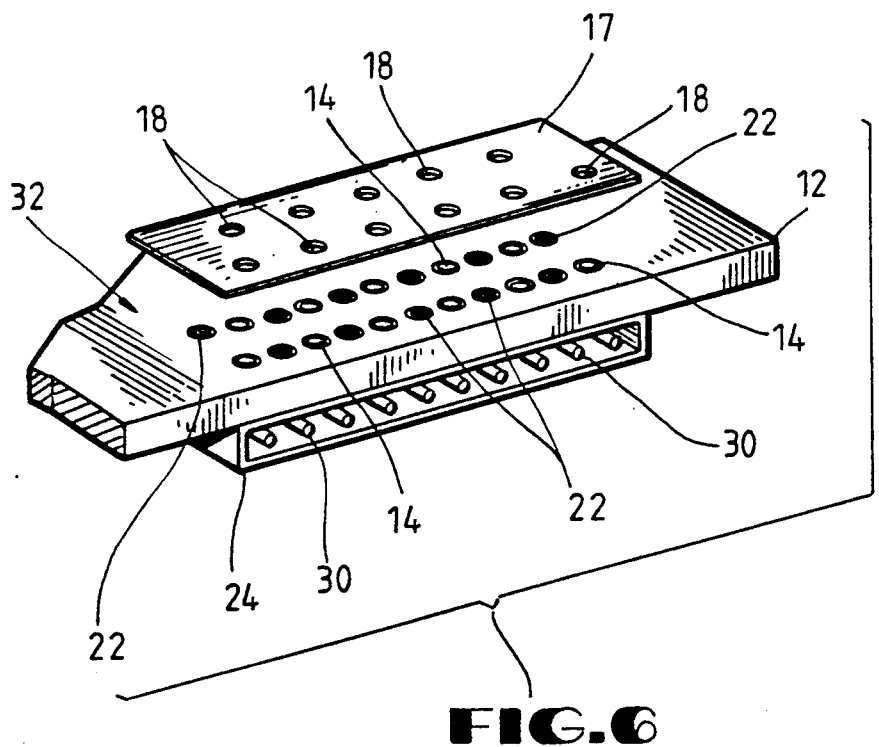
FIG. 6 shows the inverted circuit board with the stencil for the second application of solder paste positioned above the array of through-holes.

The next step in the process is illustrated in FIG. 6. Printed circuit board 12 is inverted so that undersurface 32 now faces upward. Connector 24 can be seen on the opposite side of PCB 12. Second stencil 17 is shown in exploded fashion positioned above surface 32. It will be noted that stencil 17 has openings 18 which are positioned to align with those plated through-holes 14 not having solder paste applied from the upper surface 10 through stencil 16. In the same manner as that described above, stencil 17 is laid on surface 32 and solder paste is subsequently wiped across its upper surface, depositing solder paste on every other plated through-hole 14. Stencil 17 is subsequently removed, and the populated circuit board is heated to melt the solder in solder paste 22 thereby forming both an electrical and a mechanical connection of component 24 to PCB 12.

In the practice of the present invention, solder paste may be applied by any suitable means either manually or by machine. As described above, one preferred means of applying the solder paste is to position a stencil (typically a stainless steel or brass sheet or foil about 0.008 inch thick) having appropriate cutout portions which align with selected through-holes to which the connector or other component is to be mounted (as well as with any other solder pads which are to receive solder paste) over one surface of the PCB and then wiping the solder paste across the surface of the stencil with a squeegee or doctor blade. The stencil is subsequently lifted from surface of the PCB leaving areas of solder paste having approximately the thickness of the stencil. Similarly, solder paste may conveniently be screen printed onto the surface of the PCB.

It has been found that the quantity of solder paste may be varied by adjusting the thickness of the solder paste deposit, the area of the deposit, or both. In a preferred embodiment, through-holes having an inside diameter of about 0.024 inch and an outside diameter of about 0.038 inch were covered with deposits of solder paste each having an area of about 0.003 square inch and a thickness of about 8 mils. One preferred solder paste is Kester R229-25 (Kester Solder Division, Litton Industries, Inc., Des Plaines, Ill. 60018-2632). It is contemplated that any solder paste suitable for an SMT process could be effectively used in the practice of the present invention.

Most commonly, the invention will be practiced in conjunction with circuit boards designed for surface mount components. Thus, the solder paste used to mount the through-hole devices may conveniently be applied by the same stencil and at the same time as the solder paste used to connect the electrical components to the PCB is applied.

Following application of the solder paste (and subsequent to the placement of components) the PCB is heated to a temperature and for a time sufficient to melt the solder paste. This heating may be conveniently accomplished in a reflow oven of the type used in a conventional SMT process. In a preferred embodiment of the process, a Vitronics Model 722 infrared oven is used (Vitronics Corporation, Newmarket, N.H. 03857-2059) which employs both infrared radiation emitted by the heater panels plus natural convection to reflow the solder. An Electrovert forced convection oven has also been successfully used in the practice of the present invention. Following reflow soldering, the circuit boards are typically cleaned to remove any flux residue and then tested.

As it melts, the solder is further drawn into the plated through-holes by capillary action. When the solder cools and solidifies, it forms solder fillets around the leads in the through-holes. The size of solder fillet may be adjusted by varying the quantity of solder paste applied to the opening of the through-hole. In the practice of this invention, it has been found that a component lead having a diameter of about 0.018 inch may be effectively attached to plated through-hole having an inside diameter of about 0.024 inch by the application of a quantity of solder paste having an area of about 0.003 square inch and a depth of about 0.008 inch.

In the practice of the present invention, the PCB may undergo one or more heating steps to melt the solder paste. For example, as described above solder paste may be applied to one side of alternating through-holes, the component inserted, the board inverted and remaining through-holes covered with solder paste before the PCB is heated to melt the solder. Alternatively, solder paste may be applied to one side of alternating through-holes, the component inserted, the board heated to melt the solder, the board inverted and remaining through-holes covered with solder paste and the PCB is heated again to melt the newly-applied solder. This second method (having two heating steps) has the advantage of securing the through-hole component to the PCB prior to inverting the board for the second application of solder paste. This may obviate the need for a separate adhesive to be applied to hold the component on the surface of the board.

If two heating steps are employed, it may be preferable to employ two different solder pastes, the first having a higher melting point and the second having a somewhat lower melting point. In this way, SMT components are affixed to one side of the circuit board and half of the leads of through-hole devices are mounted using the higher melting solder and the board is then passed through a reflow oven having a temperature sufficient to melt the first solder paste. After the board has cooled to solidify the first solder, it is inverted, a second solder paste comprising a solder having a lower melting point is applied to the opposite side of the circuit board to cover the remaining half of the through-holes, any additional SMT components are placed, and the board is heated in a reflow oven set to a temperature sufficient to melt the second solder paste but not the first solder paste. This prevents the release of components on the first side of the board (now the underside of the board) as it passes through the second reflow oven.

The present invention has been particularly set forth above in terms of specific embodiments. It is to be understood that variations upon the invention are now enabled to those skilled in the art by reason of this disclosure, which variations lie within the scope of the present teaching. Accordingly, this invention is to be broadly construed, and is limited only by the scope and spirit of the following claims.

What is claimed is:

1. A process for attaching an electrical component having a plurality of electrical leads to a printed circuit board having a corresponding plurality of plated through-holes arranged in an array comprising one or more rows with each through-hole having a first end which opens to a first side of said circuit board and a second end which opens to a second side of said circuit board which process comprises:

applying a layer of solder paste to cover the first ends of selected through-holes such that adjacent through-holes in the same row and opposing through-holes in adjoining rows of the array of through-holes are not both covered with solder paste;

inserting the leads of an electrical component from the first side of the printed circuit board into the plated through-holes;

applying a layer of solder paste to cover the second ends of the through-holes in the array of through-holes not covered with solder on their first ends; and, heating the printed circuit board to a temperature and for a time sufficient to melt the solder paste.

2. A process as recited in claim 1 further comprising the step of applying an adhesive to the printed circuit board prior to inserting the leads of an electrical component from the first side of the printed circuit board into the plated through-holes such that the adhesive mechanically bonds the electrical component to the first side of the circuit board.

3. A process as recited in claim 1 further comprising the step of applying an adhesive to the electrical component prior to inserting the leads of the electrical component from the first side of the printed circuit board into the plated through-holes such that the adhesive mechanically bonds the electrical component to the first side of the circuit board.

4. A process for attaching an electrical component having a plurality of electrical leads to a printed circuit board having a corresponding plurality of plated through-holes arranged in an array comprising one or more rows with each through-hole having a first end which opens to a first side of said circuit board and a second end which opens to a second side of said circuit board which process comprises:

applying a layer of solder paste to cover the first ends of selected through-holes such that adjacent through-holes in the same row and opposing through-holes in adjoining rows of the array of through-holes are not both covered with solder paste;

inserting the leads of an electrical component from the first side of the printed circuit board into the plated through-holes;

heating the printed circuit board to a temperature and for a time sufficient to melt the solder paste;

cooling the printed circuit board to a temperature below the melting point of the solder of the solder paste;

applying a layer of solder paste to cover the second ends of the through-holes in the array of through-holes not covered with solder on their first ends; and, heating the printed circuit board to a temperature and for a time sufficient to melt the solder paste.

5. A process as recited in claim 4 further comprising the step of applying an adhesive to the printed circuit board prior to inserting the leads of an electrical component from the first side of the printed circuit board into the plated through-holes such that the adhesive mechanically bonds the electrical component to the first side of the circuit board.

6. A process as recited in claim 4 further comprising the step of applying an adhesive to the electrical component prior to inserting the leads of the electrical component from the first side of the printed circuit board into the plated through-holes such that the adhesive mechanically bonds the electrical component to the first side of the circuit board.

7. A process for attaching an electrical component having a plurality of electrical leads to a printed circuit board having a corresponding plurality of plated through-holes arranged in an array comprising one or more rows with each through-hole having a first end which opens to a first side of said circuit board and a second end which opens to a second side of said circuit board which process comprises:

applying a layer of a first solder paste comprising solder having a higher melting point to cover the first ends of selected through-holes such that adjacent through-holes in the same row and opposing through-holes in adjoining rows of the array of through-holes are not both covered with solder paste;

inserting the leads of an electrical component from the first side of the printed circuit board into the plated through-holes;

heating the printed circuit board to a temperature and for a time sufficient to melt the solder comprising the first solder paste;

cooling the printed circuit board to a temperature below the melting point of the solder of the first solder paste;

applying a layer of a second solder paste comprising solder having a lower melting point to cover the second ends of the through-holes in the array of through-holes not covered with solder on their first ends; and, heating the printed circuit board to a temperature and for a time sufficient to melt the second solder paste but less than that required to melt the solder comprising the first solder paste.

* * * * *